United States Patent [19]

Waggoner et al.

[11] Patent Number: 4,629,834

[45] Date of Patent: Dec. 16, 1986

[54] APPARATUS AND METHOD FOR VIBRATORY SIGNAL DETECTION

[75] Inventors: Terrence C. Waggoner; James A. Simmons, both of Eugene; Marvin K. Perry, Springfield; Richard H. Tromel, Eugene, all of Oreg.

[73] Assignee: Bio-Dynamics Research & Development Corporation, Eugene, Oreg.

[21] Appl. No.: 666,654

[22] Filed: Oct. 31, 1984

[51] Int. Cl.[4] .......................... H04R 1/10; H04R 3/00; H03F 21/00; H04B 1/00

[52] U.S. Cl. ...................................... 381/68.2; 381/74; 381/119; 381/120; 381/122; 367/199

[58] Field of Search ........ 179/107 FD, 107 R, 156 R, 179/121 D, 146 R, 178, 179; 381/68, 69, 74, 92, 119, 120, 122; 340/539; 367/197, 198, 199

[56] References Cited

U.S. PATENT DOCUMENTS

| | | | |
|---|---|---|---|
| 1,299,616 | 4/1919 | Rieber | 179/121 D |
| 3,156,787 | 11/1964 | Puharich et al. | 179/107 BC |
| 3,629,521 | 11/1971 | Puharich et al. | 179/107 R |
| 3,784,745 | 1/1974 | Stearns | 179/107 R |
| 3,819,875 | 6/1974 | Velmans | 179/107 FD |
| 3,895,188 | 3/1974 | Ingraham | 179/121 D |
| 4,052,572 | 10/1977 | Schafer | 179/107 R |
| 4,237,449 | 12/1980 | Zibell | 179/107 FD |
| 4,291,411 | 9/1981 | Müller et al. | 367/197 |
| 4,354,064 | 10/1982 | Scott | 179/107 BC |
| 4,436,966 | 3/1984 | Botros | 179/121 D |
| 4,547,778 | 10/1985 | Hinkle et al. | 340/539 |

FOREIGN PATENT DOCUMENTS

| | | | |
|---|---|---|---|
| 613748 | 1/1961 | Canada | 367/199 |
| 2047779 | 4/1972 | Fed. Rep. of Germany | 179/107 BC |
| 52-33720 | 3/1977 | Japan | 179/121 D |
| 57-48894 | 3/1982 | Japan . | |

OTHER PUBLICATIONS

Thomas, Ian B. et al., "The Intelligibility of Speech Transposed Downward in Frequency by One Octave", Journal of the Audio Engineering Society, vol. 18, No. 1, Feb. 1970, pp. 56–61.

*Primary Examiner*—Gene Z. Rubinson
*Assistant Examiner*—Danita R. Byrd
*Attorney, Agent, or Firm*—Finnegan, Henderson, Farabow, Garrett & Dunner

[57] ABSTRACT

Apparatus for enhancing human hearing includes a pair of parallel-connected directional microphone elements responsive to frequencies ranging from below the audible frequency range to above the audible frequency range, the microphone elements facing in opposite directions and mounted in a parabolic reflector. The microphone element output signals are separated into infrasonic, sonic, and ultrasonic channels by filters. The infrasonic and ultrasonic channel signals are processed by a frequency heterodyning process to signals having frequencies within the range of human hearing. The channel signals are then selectively combined, amplified, and supplied to an earphone to render audible sounds outside the range of human hearing and aid in the detection, location, and classification of events of interest.

8 Claims, 6 Drawing Figures

APPARATUS AND METHOD FOR VIBRATORY SIGNAL DETECTION

BACKGROUND OF THE INVENTION

The invention relates generally to an acoustic detection system, and, more particularly, to a system which is sensitive to sounds outside the frequency range of human hearing to enable a user to enhance his hearing capability.

It is often required in police surveillance and military operations to passively detect the movement of personnel or machinery at extended distances. In many instances, vision is obscured due to darkness, low visibility, obstacles, or dense vegetation. Reception of sounds produced by personnel and machinery may thus be the only method of detecting their presence or movement. However, reception of sound waves solely in frequencies audible to human beings may not provide adequate detection capability.

Sounds outside the frequency range of human beings may, however, exhibit significantly different propagation characteristics. For example, ultrasonic (higher than audible) sound waves produced by movement of personnel, whispering, the impact of metal parts, and sharp explosions, such as from firearms, are more directional than audible sound waves. Infrasonic (lower than audible) sound waves produced by heavy machinery, large vehicles, and helicopter blade chop, on the other hand, may propagate over greater distances. It is therefore desirable to provide the capability for detection, identification, and classification of noise sources for sounds such as those described above in the ultrasonic and infrasonic ranges. Similar requirements also exist in many fields of scientific research, where the events of interest include animal and insect sounds produced in the ultrasonic range and meteorological and seismic events which produce sounds in the infrasonic range.

Events of interest may well produce a variety of sounds over a wide range of frequencies extending from below the lower frequency limit of human hearing to well above the upper frequency range thereof. Initial indication of events of interest may occur in one frequency range, whereas sounds confirming the existence of such activities may be produced in other ranges. It is therefore desirable to provide acoustic detection apparatus which can detect sound waves over a wide range of frequencies both inside and outside the frequency range of human hearing. Equipment which can detect ultrasonic or infrasonic waves has up to this time been large, heavy, and expensive, and was thus more suited to the laboratory than to the field. Accordingly, it is an objective of the present invention to provide acoustic detection apparatus which is low in cost, rugged, and light in weight so as to be suitable for portable operation in the field

SUMMARY OF THE INVENTION

In accordance with the principles of the present invention, there is provided a method for passive acoustic detection, and related apparatus responsive to sound waves outside the range of human hearing which is rugged and lightweight, as well as lower in cost than prior art apparatus. The apparatus includes transducer means for receiving vibratory signals outside the range of human hearing which are generated by events to be detected and for generating electrical signals representative of the received vibratory signals. The apparatus also includes frequency converter means connected to the transducer means for generating signals perceptible to human beings in response to the generated electrical signals.

The transducer comprises a microphone responsive to sound waves having frequencies ranging from infrasonic to ultrasonic. The output signal of the microphone is amplified and supplied in parallel to an infrasonic channel, a sonic channel, and an ultrasonic channel.

The infrasonic channel includes a low-pass filter which has a cut-off frequency somewhat above the lower frequency limit of human hearing and which is connected between the microphone element output and a frequency converter. The frequency converter includes an oscillator and mixer which produces, by the frequency hetereodyning process, an output frequency within the range of human hearing which is equal to the sum and difference of the output signal frequencies of the low-pass filter and the oscillator.

The sonic channel includes a band pass filter having a lower cut-off frequency approximately equal to the cut-off frequency of the low-pass filter and an upper cut-off frequency approximately equal to the upper frequency limit of human hearing.

The ultrasonic channel includes a high-pass filter connected between the microphone output and a second frequency converter including a second oscillator and a second mixer. The output of the second frequency converter is a signal having frequencies within the range of human hearing equal to the difference between the output signal frequencies of the high-pass filter and the second oscillator. The output signals of any or all of the infrasonic, sonic, and ultrasonic channels are selectively passed through a channel selector and mixer, and an appropriate amplifier to an output transducer, such as a headphone. The system thus provides the ability to detect and analyze sounds outside the range of human hearing by converting them to sounds within the range of human hearing. The result is low cost, rugged, lightweight apparatus well suited for use in the field.

The accompanying drawings, which are incorporated in, and constitute a part of this specification, illustrate one embodiment of the invention, and together with the description serve to explain the principles of the invention.

DESCRIPTION OF THE PREFERRED EMBODIMENT

Figure 1:
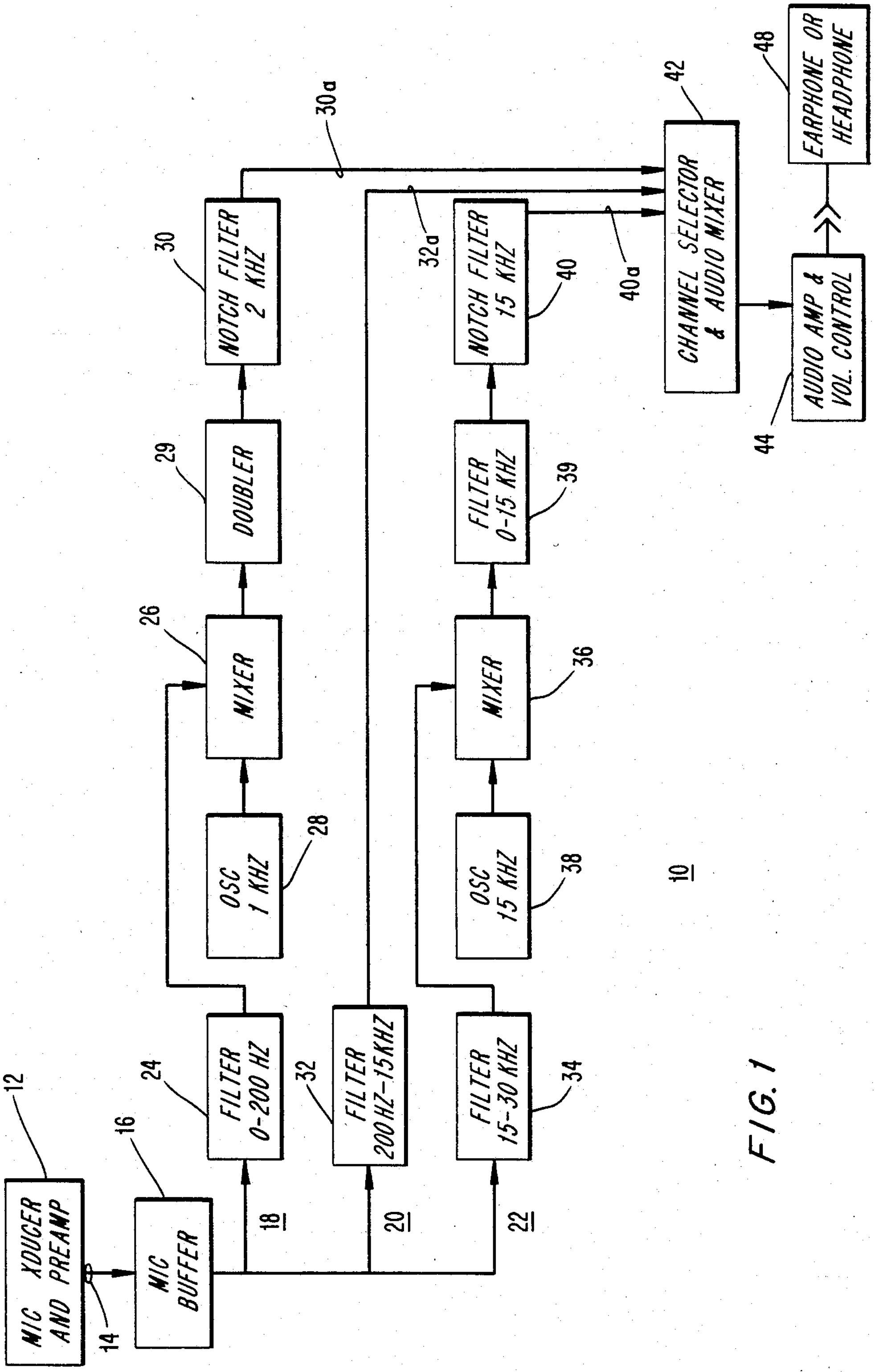
FIG. 1 is a block diagram of passive acoustic detection apparatus which is preferred embodiment of the invention.

Referring now to the drawings in which like reference characters refer to corresponding elements, FIG. 1 shows a block diagram of an acoustic detection system 10 which is a preferred embodiment of the present invention. The invention includes transducer means for receiving vibratory signals outside the range of human hearing which are generated by events to be detected and for generating electrical signals representative of the received sound waves. In the preferred embodiment, the transducer means is responsive to airborne sound waves and comprises includes a microphone transducer and preamplifier 12 and microphone buffer 16 as shown in FIG. 1.

The microphone transducer and preamplifier 12 in the preferred embodiment comprises a pair of parallel-connected electret microphone elements which may be, for example, type BT-1759 electret microphone elements obtainable in commercial quantities from the Knowles Corporation. The preamplifier is of conventional construction and may include a two-stage preamplifier circuit using a pair of NE5534 operational amplifiers obtainable in commercial quantities from the Motorola Corporation. Specific methods of constructing such preamplifiers are described in the *IC Op Amp Cookbook*, by Walter G. Jung published by the Howard Sams Corporation. In a preferred embodiment, the preamplifier provides approximately 65 dB of gain.

Although the transducer means of the preferred embodiment is responsive to airborne sound waves, the invention is not so limited. In alternative embodiments, microphone transducer and preamplifier 12 may comprise a hydrophone responsive to sound waves transmitted through liquids such as water, or seismic sensors responsive to vibrations transmitted through the earth. Furthermore, such hydrophones and sensors may be present either signly or in combination with each other or with microphone elements.

The output of the microphone transducer and amplifier 12 is passed through a ferrite bead 14 to reduce parasitic oscillations and increase stability of the transducer and preamplifier 12, and is connected to the microphone buffer 16. The preferred embodiment comprises a trio of parallel-connected unity gain operational amplifiers which may be constructed using type MC34002 dual operational amplifiers manufactured by the Motorola Corporation.

The invention also includes converter means connected to the transducer means for generating signals perceptible to human beings in response to the electrical signals generated by the transducer means. As embodied herein, the converter means includes an ultrasonic channel 22 connected to the output of microphone buffer 16, a channel selector and audio mixer 42, an audio amplifier and volume control 44, and an earphone 48. Also connected to microphone buffer 16 is an infrasonic channel 18 and a sonic channel 20.

Infrasonic channel 18 includes a filter 24 which in the preferred embodiment is an 8-pole Butterworth low-pass filter having an upper cut-off frequency of 200 Hz. The filter 24 may be constructed using a Motorola type MC34004 quad operational amplifier as described in the article "RC Filter Design By The Numbers" by Russell Kincaid, published in the October 1968 issue of Electronic Engineer magazine, the disclosure of which is hereby expressly incorporated by reference. The output of filter 24 is connected to a mixer 26, which is also supplied with the output signal from an oscillator 28. Mixer 26 processes the output signals of filter 24 and oscillator 28 through a frequency heterodyning process to produce an output signal having a frequency equal to the sum and difference of the output signal frequencies of filter 24 and oscillator 28. In a preferred embodiment, oscillator 28 has an operating frequency of 1000 Hz and employs a type XR-2206 integrated circuit oscillator obtainable in commercial quantities from the Exar Corporation.

The output of mixer 26 is connected to a frequency multiplier circuit which in the preferred embodiment constitutes a frequency doubler 29 producing an output signal having a frequency of twice that of the output signal of mixer 26. In a preferred embodiment, mixer 26 and frequency doubler 29 each include a type MC1496 balanced modulator-demodulator obtainable in commercial quantities from the Motorola Corporation. The specific electrical configuration of mixer 26 and doubler 29 are well-known to those skilled in the art and are described in detail in *Motorola Linear Integrated Circuits*, a data book published in 1979 by the Motorola Corporation.

The output signals supplied by microphone buffer 16 emerge from filter 24 ranging in frequency from DC (0 Hz) to 200 Hz. These signals are processed by mixer 26 such that they range in frequency from 800 Hz to 1200 Hz and are supplied as input to frequency doubler 29. The output of frequency doubler 29 thus constitutes a signal having frequencies ranging from 1600 Hz to 2400 Hz. This output signal is passed through a notch filter 30 having a rejection frequency of 2000 Hz to eliminate bleed-through of signals from oscillator 28. The specific construction of notch filter 30 is well-known to those skilled in the art and is described in detail in the aforementioned *IC Op Amp Cookbook*.

It can thus be appreciated that infrasonic channel 18 converts signals having frequencies below the range of human hearing to signals having frequencies well within the range of human hearing.

The output of microphone buffer 16 is also supplied to sonic channel 20, which includes a bandpass filter 32 having upper and lower cut-off frequencies of 200 Hz and 15 KHz, respectively. Filter 32 in the preferred embodiment is a 3 db ripple 8-pole Chebychev bandpass filter having 4 poles of roll-off for each edge of the filter. Filter 32 may also be constructed using a Motorola type MC 34004 quad operational amplifier using principles well-known to those skilled in the art as described in the above-identified article by Russell Kincaid.

Ultrasonic channel 22 includes a bandpass filter 34 having upper and lower cut-off frequencies of 15 KHz and 30 KHz, respectively. Filter 34 in the preferred embodiment is identical to filter 32 with the exception of the cut-off frequencies. The output of filter 34 is connected to a mixer 36, which is also connected to the output of an oscillator 38 having a frequency of 15 KHz. Mixer 36 combines the outputs of filter 34 and oscillator 38 in a frequency heterodyning process to provide an output signal having frequencies equal to the sum and difference between the output frequencies of filter 34 and oscillator 38. The output signal of mixer 36 thus has a frequency ranging from 0 to 15 KHz. Oscillator 38 is identical to oscillator 28, with the exception of the operating frequency. Mixer 36 is identical to mixer 26 and can thus be constructed using a type MC 1496 balanced modulator-demodulator integrated circuit device connected according to information contained in the above-mentioned Motorola data book.

The output of mixer 36 is supplied to a low pass filter 39 having a cut-off frequency of 15 KHz, the output of which is passed through a notch filter 40 having a rejection frequency of 15 KHz. Filter 39 is a 3 dB ripple 4 pole Chebychev filter designed according to well-known principles described in the above-identified article by Kincaid, and filter 40 is designed according to principles described in the aforementioned *IC Op Amp Cookbook*. Filters 39 and 40 ensure that the output of ultrasonic channel 22 is free from noise signals having frequencies of 15 KHz and above. Ultrasonic channel 22 thus converts signals having frequencies above the range of human hearing to frequencies substantially within the range of human hearing.

The output signals from infrasonic channel 18, sonic channel 20, and ultrasonic channel 22 are each supplied to channel selector and audio mixer 42. These three output signals may thus be selected and combined in any desired combination and supplied to audio amplifier and volume control 44. The output of audio amplifier and volume control 44 is passed through a 100 mH inductor 46 and supplied to an output transducer which in the preferred embodiment comprises earphone 48. Earphone 48 may be a conventional in-the-ear device having an input impedance of, for example, 4–100 ohms. Inductor 46 is provided to increase stability of audio amplifier and volume control 44 when operated under high gain conditions.

Figures 2A, 2B, 3:
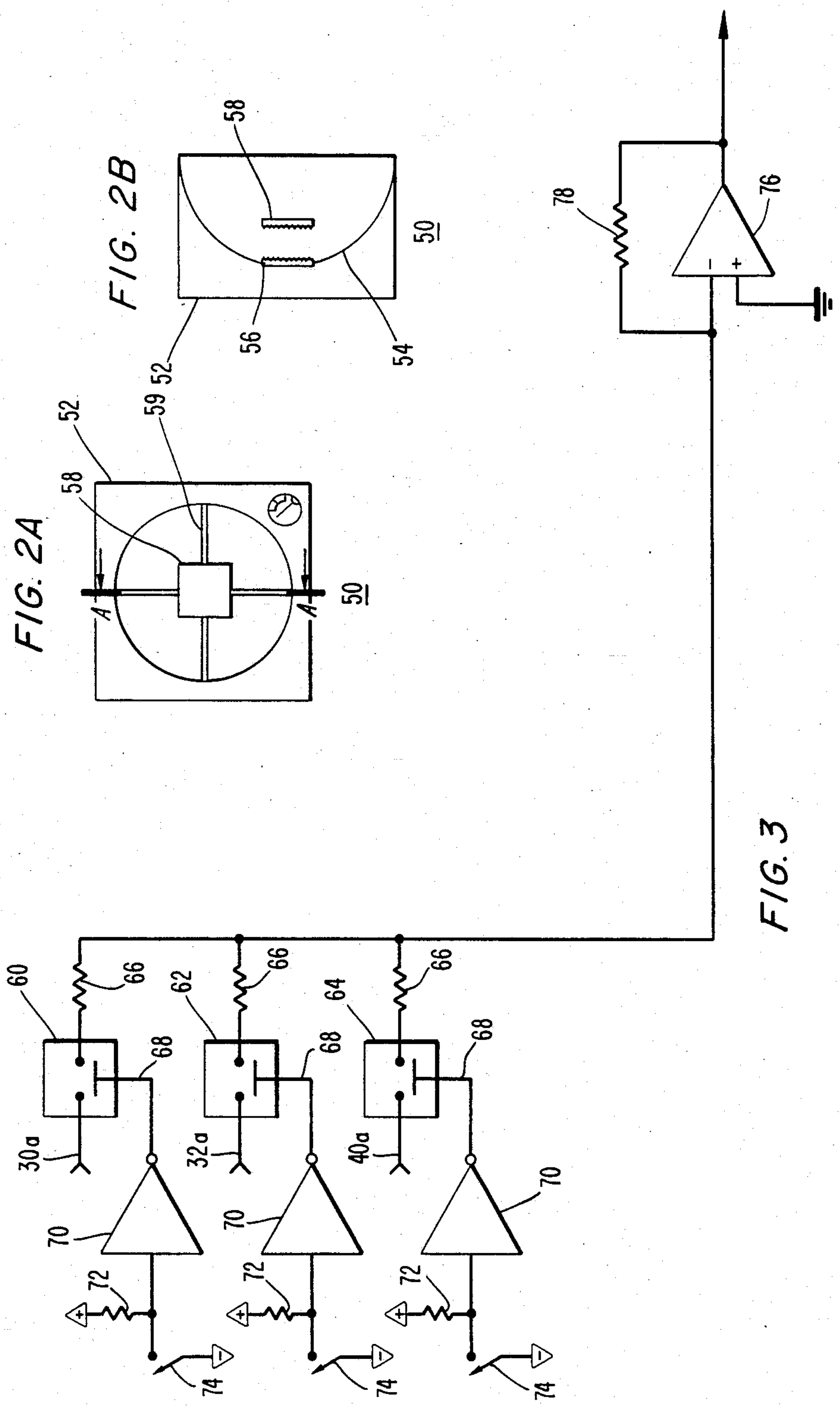
FIGS. 2A and 2B are front elevational views and side sectional views, respectively, of a transducer of the apparatus shown in FIG. 1.
FIG. 3 is an electrical schematic diagram of the channel selector and audio mixer shown in FIG. 1.

Microphone transducer and preamp 12 may include a microphone and reflector assembly 50 shown in greater detail in FIGS. 2A and 2B. Assembly 50 is mounted in a box 52 of any suitable material such as aluminum or polystyrene. In a preferred embodiment, box 52 has height, width and depth dimensions of approximately 3 inches, 3 inches and 1½ inches, respectively. A parabolic reflector 54 of material such as polystyrene is mounted in the box 52. Reflector 54 has a diameter of approximately 2½ inches and a depth of approximately of 1½ inches. First and second directional microphone elements 56 and 58 are positioned as shown in FIGS. 2A and 2B. Element 56 is mounted on the reflecting surface of reflector 54 at the center thereof and is mounted with its direction of maximum sensitivity facing to the right as seen in FIG. 2B. Element 58 is mounted in the center of reflector 54 by struts 59, and is offset from the reflecting surface thereof by a distance which in the preferred embodiment is approximately 0.445 inches, with its direction of maximum sensitivity facing to the left as seen in FIG. 2B. It has been determined that placement of microphone elements in this manner is particularly effective in obtaining a flat frequency response from below the lower frequency limit of human hearing to well above the upper frequency limit of human hearing. The outputs of microphone elements 56 and 58 are connected parallel in a conventional manner to a preamplifier as described above.

An electrical schematic diagram of channel selector and audio mixer 42 is shown in FIG. 3. As can be seen therein, the output signals of filters 30, 32, and 40 from channels 18, 20, and 22, respectively, are connected over lines 30*a*, 32*a*, and 40*a* to analog bilateral electronic switches 60, 62, and 64, respectively. Each of the switches 60, 62 and 64 includes an input terminal connected to filters 30, 32, 34, respectively, an output terminal connected to one end of separate dropping resistors 66, and a control terminal 68. Control terminals 68 are each connected to the output terminal of inverters 70. Separate pull-up resistors 72 are connected between the input of each inverter 70 and the positive terminal of a power supply. The input of each inverter 70 is also connected through a switch 74 to the negative terminal of a power supply. Switches 60, 62, and 64 are of conventional construction and may be type 4016 CMOS switches available in commercial quantities from Motorola. Similarly, inverters 70 are of conventional construction and may be type 4049 CMOS inverters also obtainable from Motorola.

Operation of any of the switches 74 to connect the associated inverter input terminal to the negative power supply is operative to provide a positive signal to input terminal 68 of the respective switches 60, 62, and 64, thus establishing a low impedance path between the input and output terminals of the associated switch. Signals from channels 18, 20, and 22 are supplied in parallel over dropping resistors 66 to the input of an operational amplifier 76, acting as a summing, or mixing circuit, through the action of feedback resistor 78. Operational amplifier 76 may be, for example, one half of a type MC 34002 dual operational amplifier obtainable from Motorola.

The construction of channel selector and audio mixer 42 is provided to ensure superior reliability in harsh environments commonly encountered under field conditions. Specifically, switches 60, 62, and 64 are sensitive to non-nominal voltages applied to input terminals 68. Thus, direct connection of a power supply terminal through switch contacts subject to corrosion and degradation could result in unreliable operation. On the other hand, inverters 70 are very tolerant of a wide range of input voltages and are thus not susceptible to improper operation due to poor condition of the contacts of switches 74. Accordingly, the construction shown in FIG. 3 provides superior performance under field conditions.

Figure 4:
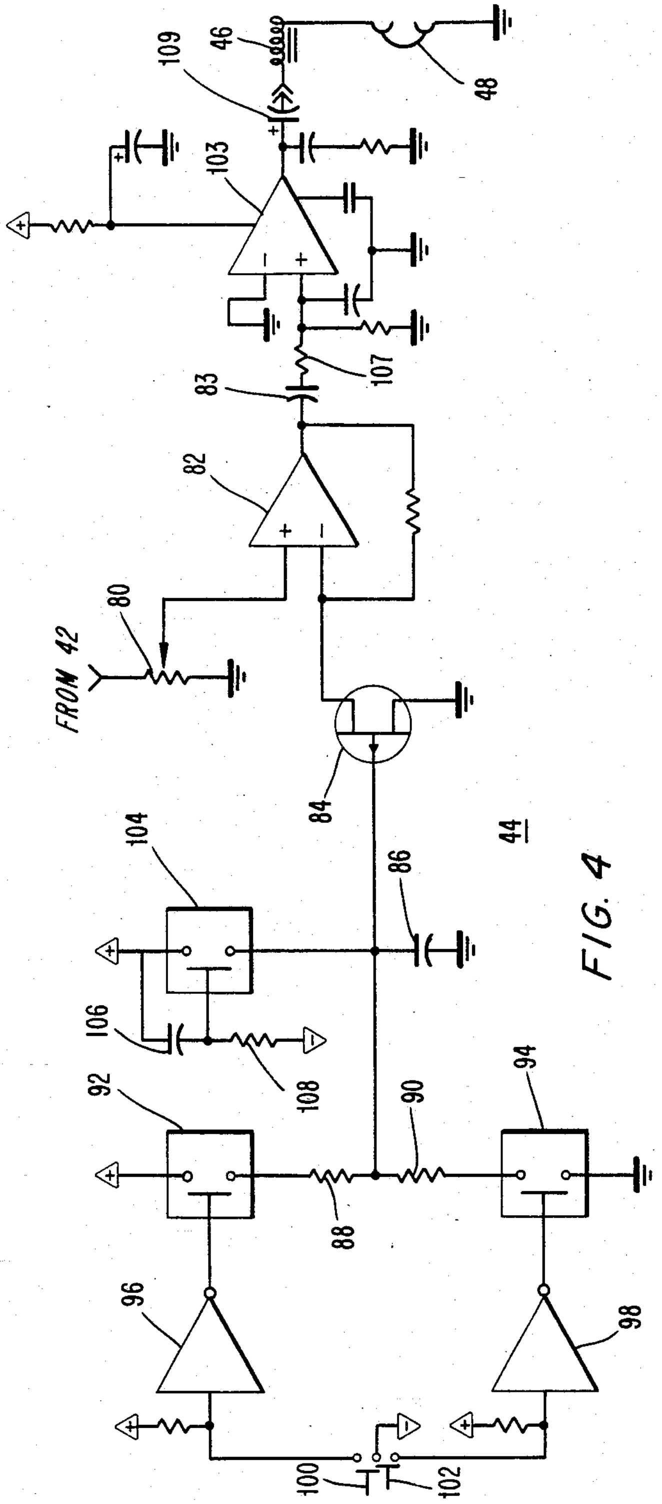
FIG. 4 is an electrical schematic diagram of the audio amplifier and volume control shown in FIG. 1.

FIG. 4 is an electrical schematic diagram of audio amplifier and volume control 44. Output signals from channel selector and audio mixer 42 are provided through a system gain potentiometer 80 to one input of an operational amplifier 82 functioning as a voltage controlled amplifier. Operational amplifier 82 may be, for example, one half of a type MC 34002 dual operational amplifier available for Motorola. The other input of operational amplifier 82 is connected to the drain terminal of a field effect transistor 84, the source terminal of which is grounded. Field effect transistor 84 is operated over its linear range and functions as a variable resistor connected between an input of operational amplifier 82 and ground. The voltage supplied to the gate of field effect transistor 84 is set by a capacitor 86. Capacitor 86 is in turn charged or discharged through high value resistors 88, 90 and analog switches 92, 94 which serve to selectively connector capacitor 86 to either the positive power supply terminal or ground. Switches 92 and 94 are in turn controlled by inverters 96 and 98, the inputs of which are controlled by push button switches 100 and 102, respectively.

Operation of which 102 places the input of inverter 98 at a negative voltage potential, thus causing activation of analog switch 94 which permits capacitor 86 to slowly discharge through resistor 90 to ground. This in turn causes the impedance of field effect transistor 84 to slowly decrease, thus causing the output of preamplifier 82 to slowly increase.

In a similar manner, operation of switch 100 will, through the action of inverter 96, activate switch 92 and cause capacitor 86 to slowly charge to a value approaching that of the positive power supply terminal. This in turn increases the impedance of field effect transistor 84 to decrease the output of preamplifier 82 and lower the volume of signals supplied to earphone 48.

An analog switch 104 is connected between capacitor 86 and the positive power supply terminal. Switch 104, in conjunction with a capacitor 106 and a resistor 108, insures that when the system 10 is first energized the volume from earphone 48 will be low, to avoid initial discomfort to the user. As capacitor 106 charges, switch 104 will open and volume can be set in the manner described above.

The output of preamplifier 82 is connected through a coupling capacitor 83 and resistor 107 to an output amplifier 103 which is of conventional construction and may include, for example, a type LM 386 integrated circuit audio output driver obtainable from the National Semiconductor Corporation. The output of amplifier 103 is connected through a coupling capacitor 109 and inductor 46 to earphone 48.

Figure 5:
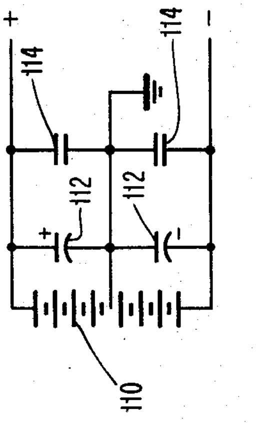
FIG. 5 is an electrical schematic diagram of the power supply of the apparatus of FIG. 1.

Power for the system 10 may be supplied by a battery pack providing appropriate voltages. In the preferred embodiment, eight 1.5 volt dry cell batteries 110 are connected to form a plus and minus 6 volt power supply as shown in FIG. 5. A pair of electrolytic capacitors 112 and a pair of disc capacitors 114 are connected across the power supply terminals as shown in FIG. 5. Capacitors 112 and 114 suppress parasitic oscillation which might otherwise occur due to the varying impedance characteristics of the batteries 110.

All components of the system 10, with the exception of microphone transducer and preamplifier 12 and earphone 48 are contained in a small portable package which may be mounted on the belt of the operator. Microphone transducer and preamplifier 12 may be mounted on a harness at chest level. Earphone 48 is, of course, mounted in the ear. Alternatively, headphones may be supplied in place of earphone 48.

In operation, the operator may select any or all of the channels 18, 20 and 22 to listen to sounds in the infrasonic, sonic, or ultrasonic ranges, respectively. It has been found that when the operator is moving, it is often convenient to activate only the sonic channel 20, since considerable infrasonic and ultrasonic noise is generated as the operator walks. When the operator remains stationary, the infrasonic or ultrasonic channels may be activated, thus permitting the operator to detect sounds in these frequency ranges that represent activities which do not produce sounds in the sonic range that are detectable at the same distance. Accordingly, the ability of the operator to detect, identify, and classify sounds is considerably enhanced.

It has been determined that filter cut-off frequencies as described above produce highly satisfactory results. However, other filter cut-off frequencies are possible. For example, it has been determined that considerable sonic energy is present in the lower frequencies within the range of human hearing of, for example, roughly 50 to 200 KHz. Sounds in these frequency ranges may thus mask desired sounds in the upper sonic range. Accordingly, the operator may select only the sonic channel for operation. At certain times, when it is suspected that activities may be occurring which generate infrasonic waves, the sonic channel may be deactivated and the infrasonic channel activated. Sounds of interest, such as heavy vehicles and helicopter rotor chop, may then be detected. Cut-off frequencies of 200 Hz, that is, above the lower frequency limit of human hearing, for filters 24 and 32 thus provide superior performance.

Clandestine communication between multiple operators each equipped with systems 10 is possible in the ultrasonic range by lightly tapping certain objects together to produce sounds inaudible in the sonic range but readily detectable in the ultrasonic range.

It is possible to provide some of the benefits of the present invention using a system 10 which includes only one of the channels 18 or 22. However, increased performance is possible in a system including two or more of channels 18, 20, or 22 over that provided by only a single channel, due to the varying nature of sound sources and propagation characteristics in the various frequency ranges.

It will be apparent to those skilled in the art that various modifications and variations can be made in the detection system of the present invention, and in the construction of the specific circuitry, without departing from the scope or spirit of the invention. For example, the various filters can have more or fewer poles depending on the specific characteristics desired and the ultimate cost of the system. Also in certain applications output transducers such as strip chart recorders or threshold alarms may be substituted for earphone 48. Thus, it is intended that the present invention cover modifications and variations of this invention provided they come within the scope of the appended claims and their equivalents.

What is claimed is:

1. Passive vibratory signal detecting apparatus, comprising:

first transducer means for receiving vibratory signals outside the frequency range of human hearing generated by events to be detected and for generating electrical signals representative of said received vibratory signals; and converter means connected to said first transducer means for generating signals perceptible to human beings in response to said generated electrical signals, said converter means comprising second transducer means for producing sound waves within the range of human hearing in response to said generated electrical signals and frequency conversion means for converting said electrical signals to frequencies within the range of human hearing, said frequency conversion means comprising a first frequency converter responsive to signals having frequencies below the range of human hearing and a second frequency converter responsive to signals having frequencies above the range of human hearing.

2. Apparatus as recited in claim 1 wherein said first transducer means is additionally responsive to sound waves having frequencies within the range of human hearing and said apparatus further comprises a circuit connected to said first transducer means and responsive to signals having frequencies within the range of human hearing, and means for selectively connecting the outputs of said circuit, said first frequency converter, and said second frequency converter to said second transducer means.

3. Apparatus for enhancing human hearing, comprising:

first transducer means for receiving airborne sound waves having frequencies extending in a range from below the lower frequency limit of human hearing to above the upper frequency limit of human hearing and for producing electrical signals responsive to said received sound waves;

a high-pass filter connected to the output of said first transducer means and having a cut-off frequency which passes frequencies above the upper frequency limit of human hearing;

a band-pass filter connected to the output of said first transducer means and having an upper cut-off frequency substantially equal to the cut-off frequency of said high-pass filter and a lower cut-off frequency above the lower frequency limit of human hearing;

an oscillator;

a mixer connected to the outputs of said oscillator and said high-pass filter and producing an output signal having a frequency within the range of human hearing which is equal to the difference between the output signal frequencies of said oscillator and said high-pass filter;

an earphone;

and means for amplifying the outputs of said band pass filter and said mixer and for selectively connecting said bandpass filter and mixer outputs to said earphone.

4. Apparatus as recited in claim 3 futher comprising:

a low-pass filter connected to the output of said first transducer means and having a cut-off frequency above the lower frequency limit of human hearing;

a second oscillator having an output frequency within the range of human hearing;

a second mixer connected to the outputs of said first oscillator and said low pass filter and producing an outout signal having a frequency within the range of human hearing, said mixer output signal frequency being the sum and difference of the output signal frequencies of said low-pass filter and said second oscillator; and a frequency multiplier connected to the output of said mixer and producing an output signal having a frequency within the range of human hearing which is a multiple of the output signal frequency of said first mixer.

5. Apparatus as recited in claim 4 comprising first and second notch filters having rejection frequencies equal to the output frequencies of said first and second oscillators, respectively, and connected to the outputs of said frequency multiplier and said second mixer, respectively.

6. Apparatus as recited in claim 4, wherein the cut-off frequency of said low-pass filter is approximately 200 Hz, and the output frequency of said first oscillator is approximately 1000 Hz.

7. Apparatus as recited in claim 3 wherein said frequency multiplier comprises a frequency doubler.

8. Apparatus as recited in claim 3 wherein said amplifying and selective connecting means comprises means for connecting more than one of said frequency multiplifer, bandpass filter, and mixer outputs to said earphone.

* * * * *